(12) United States Patent
van Zeijl

(10) Patent No.: US 7,095,284 B2
(45) Date of Patent: Aug. 22, 2006

(54) AMPLIFIER DEVICE

(75) Inventor: Paulus Thomas van Zeijl, Hengelo (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/483,400

(22) PCT Filed: Jul. 11, 2001

(86) PCT No.: PCT/NL01/00529

§ 371 (c)(1),
(2), (4) Date: May 3, 2004

(87) PCT Pub. No.: WO03/007475

PCT Pub. Date: Jan. 23, 2003

(65) Prior Publication Data

US 2004/0183595 A1    Sep. 23, 2004

(51) Int. Cl.
*H03F 3/04*    (2006.01)
*H03F 3/45*    (2006.01)

(52) U.S. Cl. ........................ 330/296; 330/261

(58) Field of Classification Search ............... 330/129, 330/261, 285, 296
See application file for complete search history.

(56) References Cited

U.S. PATENT DOCUMENTS

| | | | |
|---|---|---|---|
| 5,153,528 A | 10/1992 | Back et al. | 330/254 |
| 5,229,731 A * | 7/1993 | Yamamoto | 330/296 |
| 5,287,071 A | 2/1994 | Olmstead et al. | 330/258 |
| 6,947,720 B1 * | 9/2005 | Razavi et al. | 455/333 |

* cited by examiner

*Primary Examiner*—Steven J. Mottola
(74) *Attorney, Agent, or Firm*—Nixon & Vanderhye, P.C.

(57) ABSTRACT

An amplifier device, including: at least one input contact, an amplifier section for amplifying a signal presented at said input contacts whereby an amplified signal is obtained; said amplifier section being connected to said input contact; a bias current source connected to said amplifier section for providing a bias current which at least partially controls the gain of the amplifier section, at least one output contact connected to the amplifier section, for receiving the amplified signal from the amplifier section and transmitting the amplified signal further. The bias current source is an alternating current source having an adjustable duty cycle.

9 Claims, 3 Drawing Sheets

AMPLIFIER DEVICE

This application is the US national phase of international application PCT/NL01/00529 filed in English on 11 Jul. 2001, which designated the US. This application claims priority to PCT/NL01/00529. The entire contents of these applications are incorporated herein by reference.

BACKGROUND

1. Field of the Invention

The invention relates to an amplifier device; a method for operating an amplifier device; and to electronic devices including an amplifier device.

2. Related Art and Other Considerations

In amplifier devices control of the gain of an amplifier may be required. For example in integrated receivers used for the reception of radio signals it may be necessary to control the gain if a very large (adjacent) channel interference is present in the frequency spectrum of the received signals.

It is known in the art to control the gain of an amplifier device in an analog way by changing the gain determining elements in the amplifier device. For example, if the gain is controlled by a resistance, a second resistance may be placed in series or in parallel, thus increasing or reducing the gain.

It is also known in the art to control the gain of an amplifier device with a differential pair, for instance, two bipolar transistors with their emitters connected to each other and the collectors forming differential output contacts. The desired attenuated signal is then obtained from one of the differential output contacts while the other differential output contact is disregarded.

Furthermore, it is known to control the gain of an amplifier device by adjusting the DC bias current of the amplifier device. This may for example be implemented with a bipolar junction transistor (BJT) connected with the collector to an adjustable current source. The bias current is then controlled by the voltage over the base of the BJT.

However, each of the known gain controls is disadvantageous because of one or more of the following reasons. The control curve (i.e. the attenuation as a function of control signal) may be non-linear; the implementation or design of the device is complicated and time-consuming; or the generation of the control voltage has to be implemented in an analog (not digital) way.

BRIEF SUMMARY

An amplifier which reduces at least one of these disadvantages is characterised in that the bias current source is an alternating current source having an adjustable duty cycle.

Thereby, the gain of the amplifier device may be controlled in a relatively simple manner by tuning the duty-cycle of the AC controlled bias current source. Furthermore, the gain depends in a substantially linear manner on the duty-cycle of the bias current. Also, control of the duty cycle and thereby control of the amplifier gain may be implemented with digital means, for example by counting the number of pulses from a clock. While the number of counted pulses is below a first predetermined value N, the output signal is high and if the number of counted pulses is above the first predetermined value N but below a second predetermined value M the output signal is low. The duty cycle is than given equal to N/M. Furthermore, the gain is linear with the duty-cycle, i.e. a 100% duty-cycle (equivalent to normal DC biasing) gives maximum gain and maximum power consumption, 50% duty-cycle gives half the maximum gain, and half the maximum power consumption. Thereby, if the gain is lowered for high-level signals, than the power dissipation is lowered also. Thereby, the amplifier device is especially suited for applications with limited power supply, such as wireless radios, mobile telephones and bluetooth devices.

Electronic devices including an amplifier device are also provided wherein the gain of such electronic devices may be adjusted by adjusting the gain of the amplifier device. Furthermore, the gain is linear with the duty-cycle, i.e. a 100% duty-cycle (equivalent to normal DC biasing) gives maximum gain and maximum power consumption, 50% duty-cycle gives half the maximum gain, and half the maximum power consumption. Thereby, if the gain is lowered for high-level signals, than the power dissipation is lowered also. Thereby, the electronic device is especially suited for applications with limited power supply, such as wireless radios, mobile telephones and bluetooth devices.

Furthermore, a method for controlling the gain of an amplifier device is also provided.

BRIEF DESCRIPTION OF THE DRAWINGS

Further details, effects and aspects will be described with reference to the figures in the drawings.

DETAILED DESCRIPTION

Figure 1:
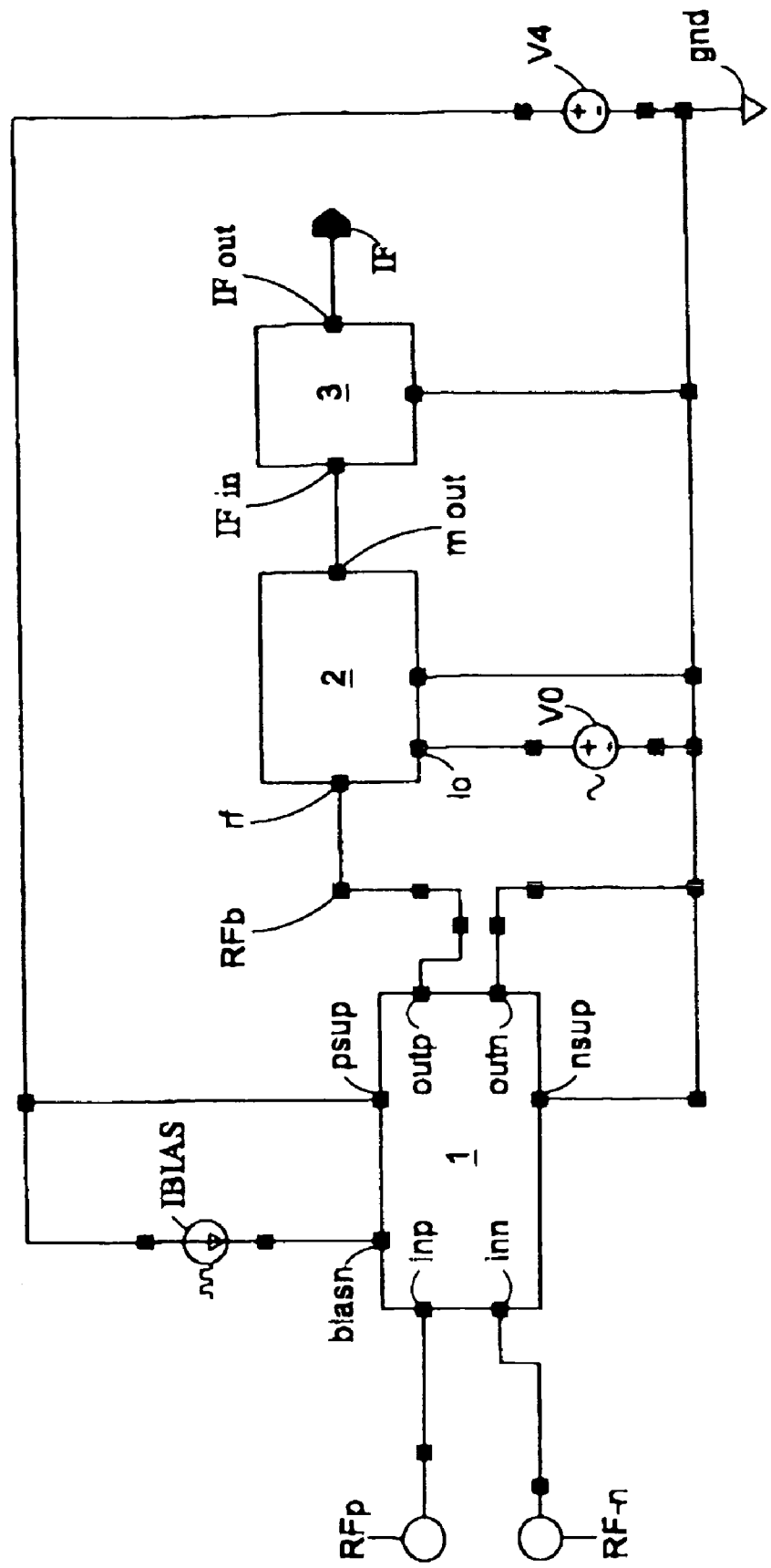
FIG. 1 shows a block diagram of an example of an embodiment of receiver front-end device.

FIG. 1 shows a receiver front-end which includes an amplifier 1, a mixer 2 and an IF-filter 3. At a first receiver input contact RFp and a second receiver input contact RFn a RF signal of radio frequency is received. First, the RF signal is amplified by the amplifier 1 whereby an amplified RF signal is obtained. The RF signal is fed into a positive amplifier input contact inp and a negative amplifier input contact inn of the amplifier 1. A current source BIAS supplies the amplifier with a bias current. The amplified RF signal is transmitted via a positive amplifier output contact outp and a negative amplifier output contact outn to an mixer input RF of mixer 2.

The mixer 2 mixes the amplified RF signal with a local oscillator (LO) signal of a local oscillator. The LO signal is generated by a LO source V0 connected to a LO input lo of the mixer 2. The mixing operation results in a mixer output signal which is transmitted to the filter 3 via a mixer output mout connected to a filter input IF_in. The mixer output signal is then filtered by the filter 3, whereby an intermediate frequency (IF) signal is obtained at a filter output IF_out.

The gain of the amplifier 1 is controlled by the bias current from the bias current source BIAS. As shown in FIG. 1 the bias current source BIAS provides a square wave bias current. That is, the bias current has either a value $I_1$ or a value $I_2$. The generation of a block signal current is generally known in the art and the bias current source may be of any type appropriate in the specific implementation. The bias current source may either be an analogue or a digital device. For example, the bias signal may be generated with a DC current source connected to one input of an edge triggered bistable (also known as flipflop) and a clock signal supplied to both the second input and the clock signal of the input. The bias signal may be generated with in any other way, for example by counting the number of pulses from a clock. While the number of counted pulses is below a first predetermined value N, the output signal is high and if the number of counted pulses is above the first predetermined value N but below a second predetermined value M the output signal is low. The duty cycle is than given equal to N/M. Furthermore, the bias current may be of any non-DC signal type, such as a sine wave signal, saw tooth signal or any other type of signal.

The gain of the amplifier section is controlled by the duty cycle of the bias current, that is the ratio of the time the bias current has the value $I_1$ and the total signal period. In a mathematical form the duty-cycle is defined as:

$$d = \frac{t_{I_1}}{t_{I_1+I2}} \quad (1)$$

In eq. (1) $t_{I_1}$ is the time the bias current has the value $I_1$ and $t_{I_1+I2}$ is the total period, that is the time signal the bias current has the value $I_1$ and the bias current source has the value $I_2$. The effective or average bias current is equal to:

$$I^{bias}_{average} = \frac{I_1 \cdot t_{I_1} + I_2 \cdot t_{I_2}}{t_{I_1+I2}} \quad (2)$$

For a low duty-cycle the effective or average biasing current will be low. Therefore, the effective or average gain of the amplifier device is low too. For higher duty-cycles, the gain increases. The duty-cycle of the amplifier bias current thus controls the gain of the amplifier in a simple manner.

Furthermore, the biasing current may be lowered for high-level signals by reducing the duty cycle of the bias current signal. Thereby the average bias current is reduced. The reduction of the average bias current results in a reduction of the power consumption of the circuit. Thereby, the receiver is especially suited for applications with limited power supply, such as wireless radios, mobile telephones and Bluetooth devices.

Figure 2:
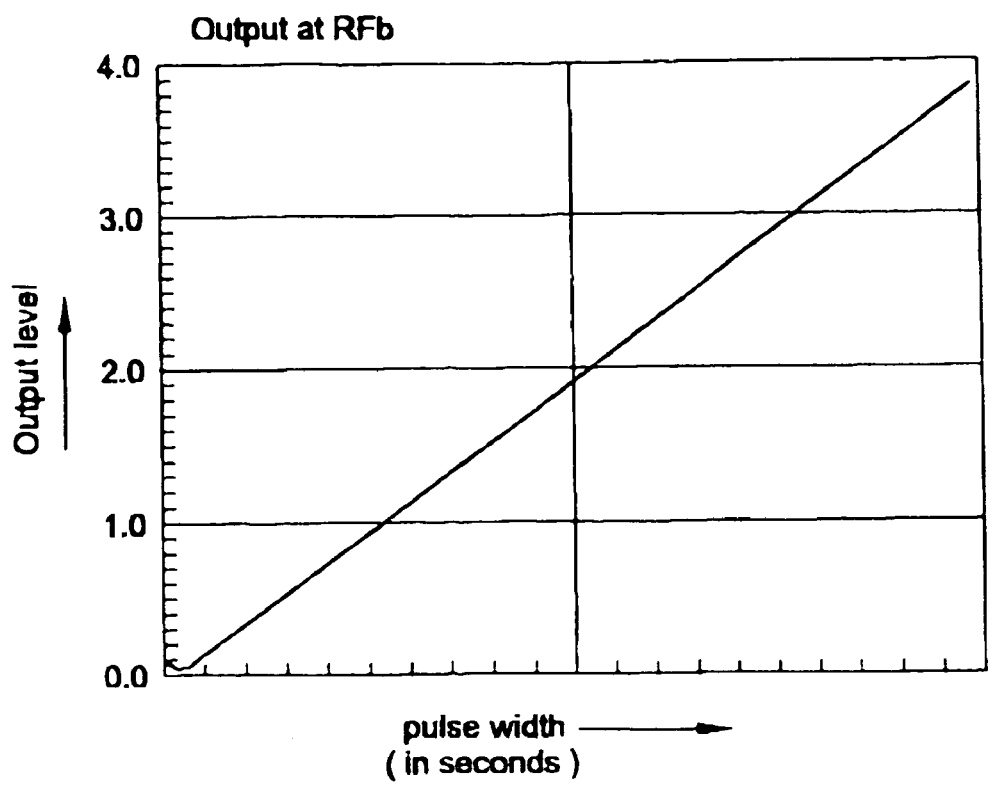
FIG. 2 shows a graph of the simulated gain as a function of the duty-cycle period of the bias current of the example of a receiver front-end device of FIG. 1.
Figure 2:
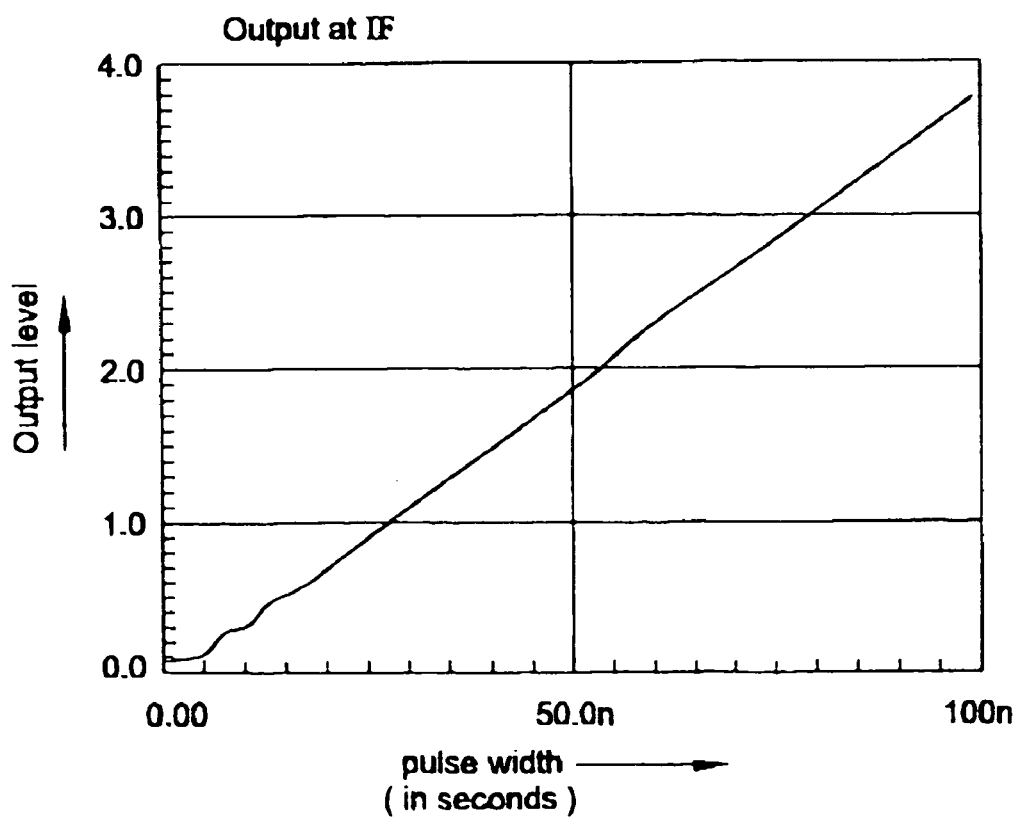

Also the gain of the amplifier device is substantially linearly dependent on the duty-cycle. FIG. 2 shows a graph of the simulated output signal level of the amplifier device (as averaged by the simulator) at contact RFb and the signal level at the filter output calculated at contact IF (as averaged by the IF-filter) as a function of the time the bias current has the value $I_1$ i.e. the pulse width of the bias current. In the simulation the following parameter values where used $I_2$ was set to zero and the mixer was supposed to be an ideal mixer. The frequency of the RF signal was 102 MHz. The amplifier was an RF amplifier in this example providing a gain of some 12 dB. The frequency of the duty-cycle modulation signal has been 10 MHz. This frequency is high enough to ensure that the bandpass filter filters the duty-cycle signal significantly, and low enough not to pose any stringent requirements on the biasing circuitry. The duty-cycle was varied from 0% (pulse time 0 ns) to 100% (pulse time 100 ns).

The invention is not limited to the parameter values used in the simulation, the parameters may be set to any appropriate value. For higher frequencies of the bias current AC signal, the spurious responses, that is the frequency components in the RF signal not substantially equal to the frequency of the RF signal, are more separated from the desired operational frequency band and are attenuated by the RF filter. As can be seen, the pulse width of the bias current determines the gain of the amplifier and the gain of the receiver itself. The gain as a function of the duty-cycle is highly linear for pulse durations between 5 and 100 nanoseconds.

An amplifier with an AC controlled bias current may behave in a mixer-like way, whereby the amplified RF signal may include extra spurious frequency components. In the front-end of FIG. 1 this may cause sensitivity of the receiver to not only the desired signal, but also other signals of frequency substantially equal to the radio frequency of the RF signal plus or minus the frequency of the AC controlled bias current. Provisions may be made to limit these spurious responses. For example, the duty-cycle periodicity of the duty-cycle signal itself may be modulated, as is known from for example delta-sigma modulators, or a pseudo-random sequence may be applied into the duty-cycle signal. Reference is made to S. R. Norsworthy, R. Schreier, G. C. Temes, "*Delta-sigma Data Converter, Theory, Design and Simulation*", IEEE PRess, 1996. For example, the frequency may be modulated to vary from 9 to 11 MHz and the duty cycle may vary as in table 1, whereby as an average the frequency is 10 MHz and the duty cycle is 30%, that is the signal has 30% of the time the value $I_1$ and 70% of the time the value $I_2$.

TABLE 1

| $I_1$ (in % of the period) | $I_2$ (in % of the period) |
|---|---|
| 30 | 70 |
| 40 | 60 |
| 20 | 80 |

Such modulation and variation of the bias signal results in a wider spread of the spurious components over the frequency spectrum. Since the total energy of the spurious components is not increased, the frequencies will be less apparent and the spurious components in the signal will have increased noise like characteristics. The variation and spread may for example be obtained by using pseudo-random-bit-sequence (prbs) signals, as are generally known in the art of standard test equipment for testing digital transmission data links (Bit Error Rate tests).

Because the amplifier is switched OFF for several RF-periods, some kind of averaging is needed. In a receiver a bandpass filter is usually available for filtering adjacent channels. In the receiver front-end shown in FIG. 1 the filter 3 averages the converted RF signal, thereby reducing unwanted spurious components. The use of an already available filter reduces the number of components in the device and thus both power consumption and complexity. However, a separate filter for averaging the signal may be connected to the amplifier instead.

In the example of a receiver shown in FIG. 1 a non-zero IF filter is used for averaging. In FIG. 1, a low-IF receiver is used, and consequently the channel filter is a band-pass filter. A zero-IF filter may also be used. In that case the channel-filter is a low-pass filter, which may be used for averaging in a likewise manner. Furthermore, the other stages in the receiver shown in FIG. 1 may be provided with an AC controlled bias current source for gain control. For example the IF filter may comprise a chain of filter stages or be a cascaded filter, as is generally known in the art. (From filter theory it is known that any high order filter may be replaced by several low order filters). The gain of the filter may then be controlled by providing one or more of the filter stages with an AC controlled bias current and setting the duty-cycle thereof to an appropriate value.

Any amplifier device having a bias current source may be provided with an AC controlled bias current source for control of the gain of the amplifier. In general, class A, A/B and B amplifiers have a bias current source. However, the invention is not limited to these amplifier classes and may be used in any type of amplifier.

Figure 3:
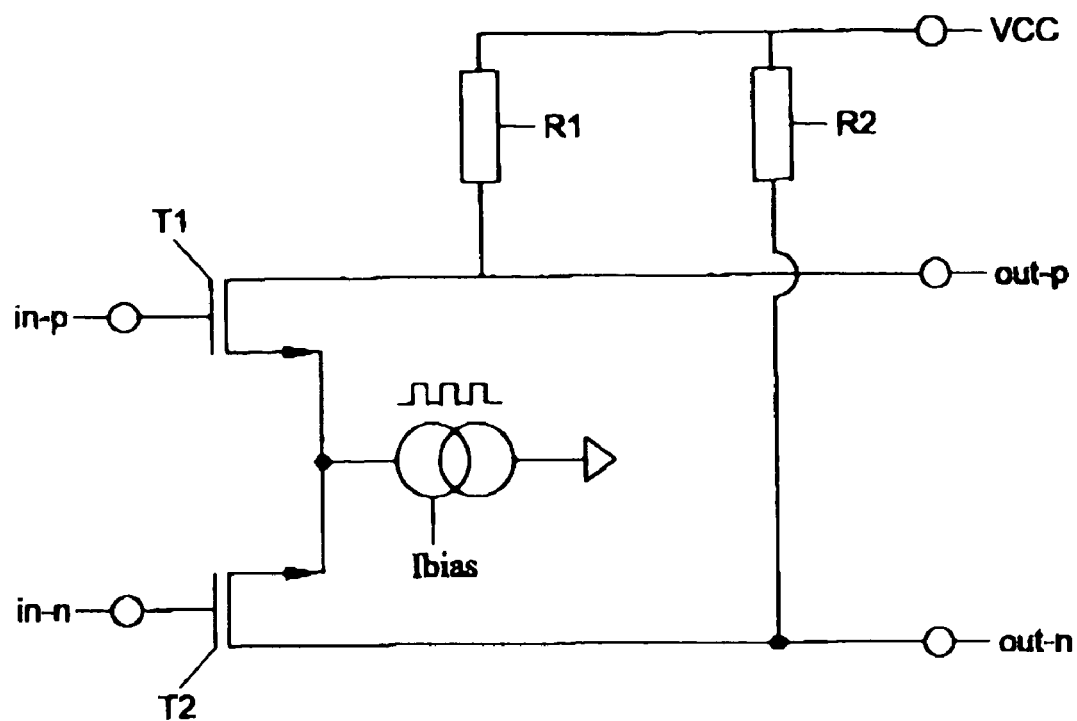
FIGS. 3–4 show circuit diagrams of examples of embodiments of amplifiers.
Figure 4:
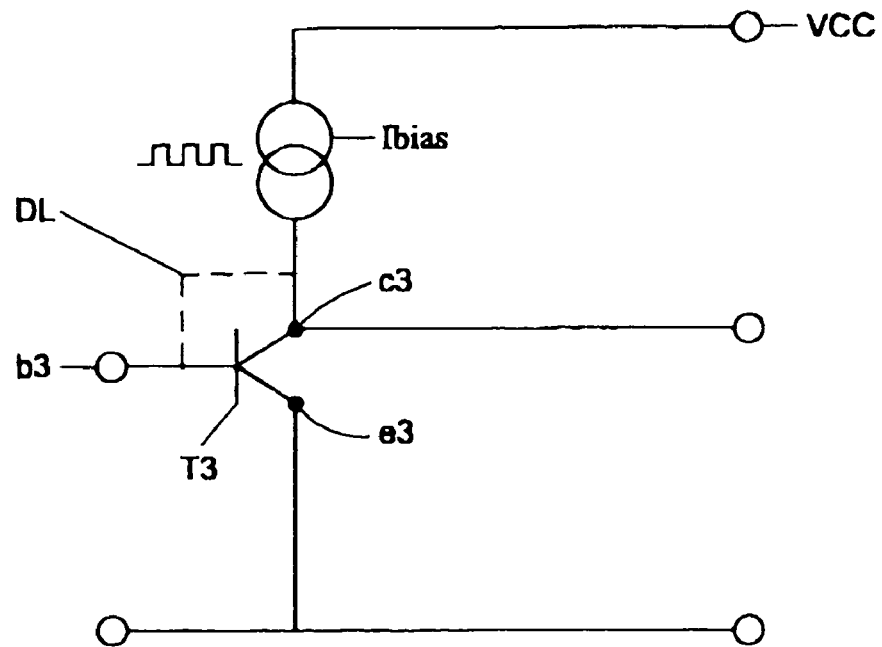

Examples of amplifier devices having a bias current are shown in FIGS. 3–4. FIG. 3 shows a differential amplifier device. The differential amplifier device includes two n-type Metal Oxide Semiconductor Field Effect Transistors (nMOSFET) T1,T2 connected to each other an a bias current source BIAS with their sources. The drain of each of the nMOSFETs is connected via a resistor R1,R2 to a voltage supply VCC. The drain of the nMOSFET T1 is a positive output contact out_p. The drain of the nMOSFET T2 is a negative output contact out_n.

FIG. 4 shows a transconductance amplifier including a bipolar junction transistor (BJT) T3. The base b3 of the BJT T3 is a positive input contact. The emitter e3 of the BJT T3 is both a negative input contact and a negative output contact of the transconductance amplifier. The collector c3 is the positive output contact c3. The collector c3 is connected to a voltage supply VCC via a bias current source Ibias. Between collector c3 and base b3 a DC-feedback loop is provided for the correct DC-baising of the transistor, as is indicated with the dotted line DC.

An amplifier device according to the invention may be implemented in any type of electronic device or electronic circuit, such as a mobile telephone, a receiver circuit, a home stereo set or measurement instruments. Implementation of an amplifier device is especially suited in wireless electronic devices with limited power supply because of the relatively low power consumption of the amplifier device. The wireless electronic device may for example be a radio, a mobile telephone or Bluetooth devices like bluetooth headsets.

An amplifier device according to the invention may be used to perform a gain control method. Such a method includes determining a required gain of the amplifier device. This may be any gain required in the specific implementation of the amplifier device. Thereafter a bias current corresponding to the required gain is generated. The bias current is an alternating current, having a duty-cycle such that the time average of the bias current is substantially equal to the bias current corresponding to the required gain.

The invention claimed is:

1. An amplifier device comprising:
   at least one input contact,
   an amplifier section connected to said at least one input contact for amplifying a signal presented at said at least one input contact whereby an amplified signal is obtained;
   a bias current source connected to said amplifier section for providing a bias current which at least partially controls the gain of the amplifier section,
   at least one output contact connected to the amplifier section, for receiving the amplified signal from the amplifier section and transmitting the amplified signal further,
   wherein the bias current source is an alternating current source having an adjustable duty cycle, said alternating current source being directly connected to the amplifier section.

2. An amplifier device as claimed in claim 1, wherein the bias current source is a square wave current source.

3. An amplifier device as claimed in claim 1, further including duty-cycle modulation means for modulating the duty-cycle to minimize spurious components in the signal.

4. An amplifier device as claimed in claim 3, wherein the duty-cycle modulation means include at least one delta-sigma modulator device.

5. An amplifier device as claimed in claim 3, wherein the duly-cycle modulation means is controlled by a duty-cycle modulation signal and wherein means are provided for selecting the frequency of the duty-cycle modulation signal for minimum spurious responses.

6. A method for controlling the gain of an amplifier, comprising:
   determining a required gain of the amplifier;
   tuning a duty-cycle of an alternating bias current such that the time average of the alternating bias current is substantially equal to the bias current corresponding to the required gain, and
   generating a bias current corresponding to the required gain by generating said alternating bias current having said tuned duty-cycle, which alterating bias current is directly provided to the amplifier.

7. An electronic device including at least one amplifier device as claimed in claim 1.

8. An electronic device as claimed in claim 7, further including:
   at least one mixer device connected to said amplifier device;
   at least one filter device connected to at least one of the mixer outputs.

9. An electronic device as claimed in claim 7, wherein the electronic device includes:
   at least one bandpass filter connected to said amplifier device, said at least one bandpass filter being a distributed filter chain including:
   at least two filter stages, at least one of said filter stages including an AC controlled bias current source having an adjustable duty-cycle which at least partially controls the gain of the filter stage.

\* \* \* \* \*